United States Patent [19]

Mochida et al.

[11] Patent Number: 6,045,318
[45] Date of Patent: *Apr. 4, 2000

[54] LEAD FRAME SUPPLYING METHOD AND APPARATUS

[75] Inventors: Tooru Mochida, Higashiyamato; Shinichi Baba, Fuchu, both of Japan

[73] Assignee: Kabushiki Kaisha Shinkawa, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/978,311

[22] Filed: Nov. 25, 1997

[30] Foreign Application Priority Data

Nov. 29, 1996 [JP] Japan .................................. 8-334912

[51] Int. Cl.⁷ .................................................. B65G 65/36
[52] U.S. Cl. ......................... 414/609; 414/416; 414/331
[58] Field of Search .................................. 414/609, 610, 414/331, 937, 331.13, 331.14, 331.15, 416, 222.02, 226.04; 364/478.02, 478.05

[56] References Cited

U.S. PATENT DOCUMENTS

| 4,378,189 | 3/1983 | Takeshita et al. ....................... 414/331 |
| 4,537,552 | 8/1985 | Slee ..................... 414/222.04 |
| 4,685,852 | 8/1987 | Rubin et al. .............................. 414/609 |
| 4,725,182 | 2/1988 | Sakamoto et al. ....................... 414/331 |
| 4,895,486 | 1/1990 | Baker et al. .............................. 414/609 |
| 5,190,434 | 3/1993 | Miura et al. .............................. 414/609 |
| 5,906,469 | 5/1999 | Oka et al. ................................. 414/416 |
| 5,941,673 | 8/1999 | Hayakawa et al. ...................... 414/416 |

FOREIGN PATENT DOCUMENTS

| S55-7944 | 2/1980 | Japan . |
| 1-32127 | 6/1989 | Japan . |
| 5-275502 | 10/1993 | Japan . |

*Primary Examiner*—Robert P. Olszewski
*Assistant Examiner*—Isobel A. Parker
*Attorney, Agent, or Firm*—Koda & Androlia

[57] ABSTRACT

A lead frame supplying method and apparatus used with, for instance, a wire bonding machine, including a sensor which detects a presence or absence of a lead frame in a frame storing section of a lead frame magazine. The sensor is installed at the level of a frame conveying path or above the level of the frame conveying path of a frame feeder that feeds lead frames to, for instance, the bonding machine and is located so that the lead frame magazine is positioned between the sensor and the frame feeder. In addition, a control unit positions a frame storing section that contains a lead frame at the level of the frame conveying path of the frame feeder when the sensor detects the absence of a lead frame in one frame storing section.

2 Claims, 4 Drawing Sheets

LEAD FRAME SUPPLYING METHOD AND APPARATUS

BACKGROUND OF THE INVENTION

1. Field of the Invention

The present invention relates to a lead frame supplying method and apparatus which supplies lead frames stored in a magazine to a frame feeder in a bonding apparatus such as a wire bonding apparatus, die bonding apparatus, etc.

2. Prior Art

A conventional bonding apparatus is described with reference to FIGS. 4(a) and 4(b).

Loader side magazines 1 (1A, 1B . . . ) and unloader side magazines 2 (2A, 2B . . . ) are respectively positioned at both ends of the guide rails 11 of a frame feeder 10. These loader side magazines 1 and unloader side magazines 2 are positioned and carried on magazine holders 5 which are respectively driven up and down by a loader side elevator 3 and an unloader side elevator 4. Lead frames 6 are stored in the loader side magazines 1 and pushed out onto the frame conveying path 11a of the guide rails 11 by a frame pusher 7.

Examples of bonding systems equipped with elevator devices of the type described above are disclosed in Japanese Patent Application Publication (Kokoku) Nos. S63-56122, H1-32127 and H2-4486.

The system described in, for example, Japanese Patent Application Publication No. S55-7944 shows no frame pusher 7 and instead includes a pull-in claw 8.

The conventional bonding apparatuses thus include either a frame pusher 7 or a pull-in claw 8; and the pull-in claw 8 is shown by a two-dot chain line in FIG. 4(a). In the apparatus that includes such a pull-in claw 8, the lead frames 6 inside the loader side magazines 1 are pulled by the pull-in claw 8 so as to be moved onto the frame conveying path 11a of the guide rails 11.

The frame feeder 10 which conveys the lead frames 6 includes a pair of guide rails 11, which have a frame conveying path 11a that guides the lead frames 6, as well as loader side feeding claws 12 and unloader side feeding claws 13. The loader side feeding claws 12 and unloader side feeding claws 13 consist of respective pairs of upper claws 12a and 13a and lower claws 12b and 13b as best shown in FIG. 4(b). The loader side feeding claws 12 and unloader side feeding claws 13 are opened and closed by claw open/close means (not shown) and are caused to move along the guide rails 11 by a claw moving means (not shown). Furthermore, a frame confirmation sensor 14 which detects the presence of a lead frame 6 is installed between the guide rails 11 so as to be on the side of the loader side magazines 1.

This type of the frame feeders 10 are described in Japanese Patent Application Publication (Kokoku) No. S63-56122 and Japanese Patent Application Laid-Open (Kokai) No. H4-346446.

A bonding apparatus 20, such as a wire bonding apparatus, die bonding apparatus, etc. is installed on one side of the guide rails 11 so as to face the bonding position 15. This bonding apparatus 20 has an XY table 21 which is driven in the X and Y directions, and a bonding head 22 is mounted on this XY table 21. In addition, a camera holder 24 to which a television camera 23 is attached is fastened to the bonding head 22. Furthermore, a bonding arm 26 to which a bonding tool 25 is attached is installed on the bonding head 22 so that the bonding arm 26 can be moved up and down along the two-dotted line in FIG. 4(b). The television camera 23 is positioned so as to be above the bonding position 15, as best seen from FIG. 4(b), and the bonding tool 25 is offset by a distance of Y1 from the television camera 23 as shown in FIG. 4(a). The bonding arm 26 is raised and lowered by a Z (vertical) driving motor (not shown).

One example of a bonding apparatus 20 of this type is described in Japanese Patent Application Laid-Open (Kokai) No. H5-275502.

With the apparatus described above, lead frames 6 inside the loader side magazines 1 are pushed out by the frame pusher 7 to a position where the lead frames 6 can be chucked by the loader side feeding claws 12. Afterward, the frame pusher 7 returns to its original position.

There are two types of pull-in claws 8 which pull out the lead frames 6: one type inserts a pull-out pin into each lead frame 6, and another type chucks each lead frame 6 from above and below.

In the case of the type which inserts a pull-out pin, the pull-in claw 8 is moved into the loader side magazine 1 and then lowered so that the pull-out pin is inserted into a hole (not shown) of a lead frame 6. Next, the pull-in claw 8 is moved in the feeding direction (toward the bonding position 15, rightward in FIGS. 4(a) and 4(b)) so as to pull out the lead frame 6 from the magazine 1 to the position 15 where the lead frame 6 can be chucked by the loader side feeding claws 12. Afterward, the pull-in claw 8 is raised and returns to its original position.

In the case of the type which chucks each lead frame from above and below to take out the lead frames, the pull-in claw 8 holding a lead frame 6 from above and below pulls the lead frame 6 out of the loader side magazine 1, and then the loader side feeding claws 12 hold the lead frame 6 and transfer the lead frame 6 to the bonding position 15.

When the frame confirmation sensor 14 detects the presence of the lead frame 6 thus taken out by either the frame pusher 7 or the claw 8 onto the guide rails 11, the loader side feeding claws 12 close and chuck the lead frame 6 and then intermittently feed the lead frame 6 along the frame conveying path 11a of the guide rails 11. In other words, an intermittent feeding action is repeated so that the loader side feeding claws 12 open, return to their original position, close and chuck the lead frame 6, and again feed the lead frame 6 by a fixed amount. The bonding portions of the lead frame 6 are thus successively fed to the bonding position 15.

Each time a bonding portion of the lead frame 6 is fed to the bonding position 15, bonding is performed by the bonding apparatus 20. After the bonding is completed, the lead frame 6 is intermittently fed by the unloader side feeding claws 13 and is stored in the unloader side magazine 2.

In the above operation, the lead frames 6 are stored in a stacked configuration with a fixed spacing in the loader side magazines 1 and unloader side magazines 2. Accordingly, each time that a lead frame 6 is supplied to the frame conveying path 11a of the guide rails 11 from one of the loader side magazines 1, and each time a lead frame 6 is transferred into one of the unloader side magazines 2 from the conveying path 11a, the loader side magazine 1 and unloader side magazine 2 are lowered by one pitch, so that the frame storing section of the loader side magazine 1 or unloader side magazine 2 which stores or is to store the next lead frame 6 is positioned at the conveying path level of the frame conveying path 11a. The "conveying path level" of the frame conveying path 1a refers to a height suitable for feeding a lead frame 6 onto the frame conveying path 11a.

In a system where two or more loader side magazines 1 (1A, 1B ...) and unloader side magazines 2 (2A, 2B ...) are stacked on the magazine holders 5 of the loader side elevator 3 and unloader side elevator 4, after the lead frame 6 in the uppermost frame storing section of one loader side magazine 1 has been fed out at the conveying path level of the frame conveying path 11a, or after a lead frame 6 has been stored in the uppermost frame storing section of one unloader side magazine 2, the loader side magazine 1 or unloader side magazine 2 is lowered so that the lowermost frame storing section of the loader side magazine 1 or unloader side magazine 2 positioned immediately above the loader side magazine 1 or unloader side magazine 2 is positioned at the conveying path level of the frame conveying path 11a.

Generally, the loader side magazines 1 (1A, 1B ...) are filled with lead frames 6 (in continuous fashion). However, there may be cases in which a worker removes a lead frame(s) 6 for the purposes of quality control from a loader side magazine 1 (1A, 1B ...) in which lead frames 6 are continuously stored. In FIG. 4(b), the reference numeral 1a shown by a two-dot chain line in the loader side magazine 1A indicates a frame storing section from which a lead frame 6 has been removed, and the frame storing section contains no lead frame 6.

In ordinary production plan, the lead frames 6 are controlled in lots; however, one lot hardly ever consists of a number of lead frames 6 equal to the number of frame storing sections times one loader side magazine (the number of frame storing sections×N (where N is the number of loader side magazines 1)). Accordingly, the last loader side magazine 1 of one lot is not always completely filled with lead frames 6. FIG. 4(b) illustrates a case wherein the loader side magazine 1B is the last magazine of one lot; and four frame storing sections of the magazine 1B are empty. In FIG. 4(b), in order to facilitate understanding, frame storing sections which do not contain lead frames are shown by two-dot chain lines.

In this situation, the loader side magazines 1 (1A, 1B ...) are lowered one stage at a time by the loader side elevator 3; and each time the magazines are lowered, a push-out operation is performed by the frame pusher 7 or a pull-in operation is performed by the pull-in claw 8, regardless of whether or not a lead frame 6 is on the stage (or in the storing section) of the loader side magazine 1 (1A, 1B, etc.).

As seen from the above, the frame pusher or pull-in claw goes through the feeding out operation even though the lead frame storing sections do not contain a lead frame. During this period, no lead frames are supplied to the frame conveying path 11a. In other words, the bonding apparatus 20 cannot perform bonding and is therefore placed in waiting, making productivity poor. Particularly when there are many frame storing sections that contain no lead frames therein, as indicated by the reference numeral 1b, unnecessary movement of the pusher 7 and pull-in claws 8 increases, and productivity drops significantly.

SUMMARY OF THE INVENTION

Accordingly, the object of the present invention is to provide a lead frame supplying method and supplying apparatus which allow the immediate positioning of lead frame storing sections of the lead frame magazine that contain lead frames at the lead frame conveying path level in order to improve productivity.

The above object is accomplished by a unique manner of the present invention for a method in which a loader side magazine is positioned and carried on a loader side elevator which is driven vertically, and lead frames stored in the loader side magazine are fed out and supplied to a frame feeder, and the present invention is characterized in that a sensor which detects the presence or absence of a lead frame inside the loader side magazine is installed at the frame conveying path level or above the frame conveying path level of the frame feeder so as to be on the opposite side of the loader side magazine from the frame feeder; and when this sensor detects the absence of a lead frame, the next frame storing section which contains therein a lead frame is positioned at the frame conveying path level of the frame feeder.

The above object is also accomplished by a unique structure of the present invention for a lead frame supplying apparatus in which a loader side magazine is positioned and carried on a loader side elevator which is driven vertically, and lead frames stored inside the loader side magazine are fed out and supplied to a frame feeder, and the apparatus of the present invention is characterized in that a sensor is installed at a frame conveying path level or above the frame conveying path level of the frame feeder on the opposite side of the loader side magazine from said frame feeder so as to detect the presence or absence of a lead frame inside the loader side magazine; and a control circuit which has a control unit is provided so that the control unit positions the next frame storing section in which a lead frame is stored at the frame conveying path level of the frame feeder when the sensor detects the absence of a lead frame.

BRIEF DESCRIPTION OF THE DRAWINGS

FIG. 1 illustrates the schematic layout of one embodiment of the lead frame supplying method and apparatus of the present invention, in which

FIG. 4 illustrates the schematic layout of the conventional lead frame supplying method and apparatus, in which

DETAILED DESCRIPTION OF THE INVENTION

Figure 1A:
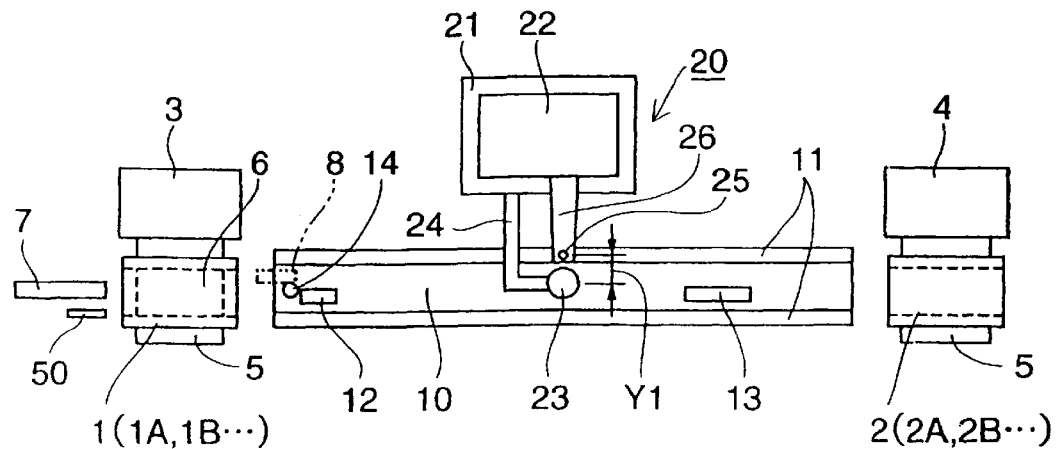
FIG. 1(a) is a top view thereof.

One embodiment of the lead frame supplying method and apparatus of the present invention will be described with reference to FIGS. 1 through 3. Parts which are the same as in FIG. 4 or which correspond to those in FIG. 4 will be labeled with the same symbols, and a detailed description of such parts will be omitted.

As seen from FIG. 1, in the lead frame supplying method and apparatus of the present invention, loader side magazines 1 (1A, 1B ...) are positioned and carried on a loader side elevator device 3 which is driven upward and downward, and either a frame pusher 7 or a pull-in claw device 8 is provided so as to feed out and supply lead frames 6 stored in the loader side magazines 1 to a frame feeder 10; and the present invention incorporates a new step and elements to this method and apparatus.

Figure 1B:
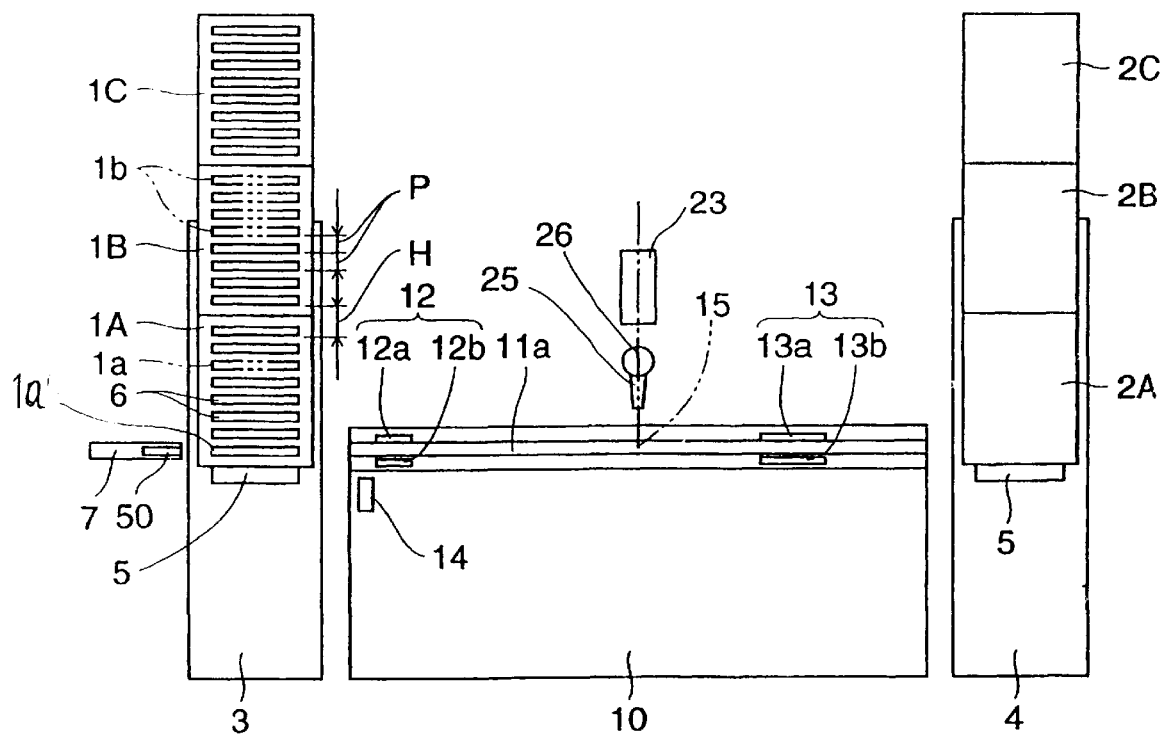
FIG. 1(b) is a front view thereof.
Figure 2:
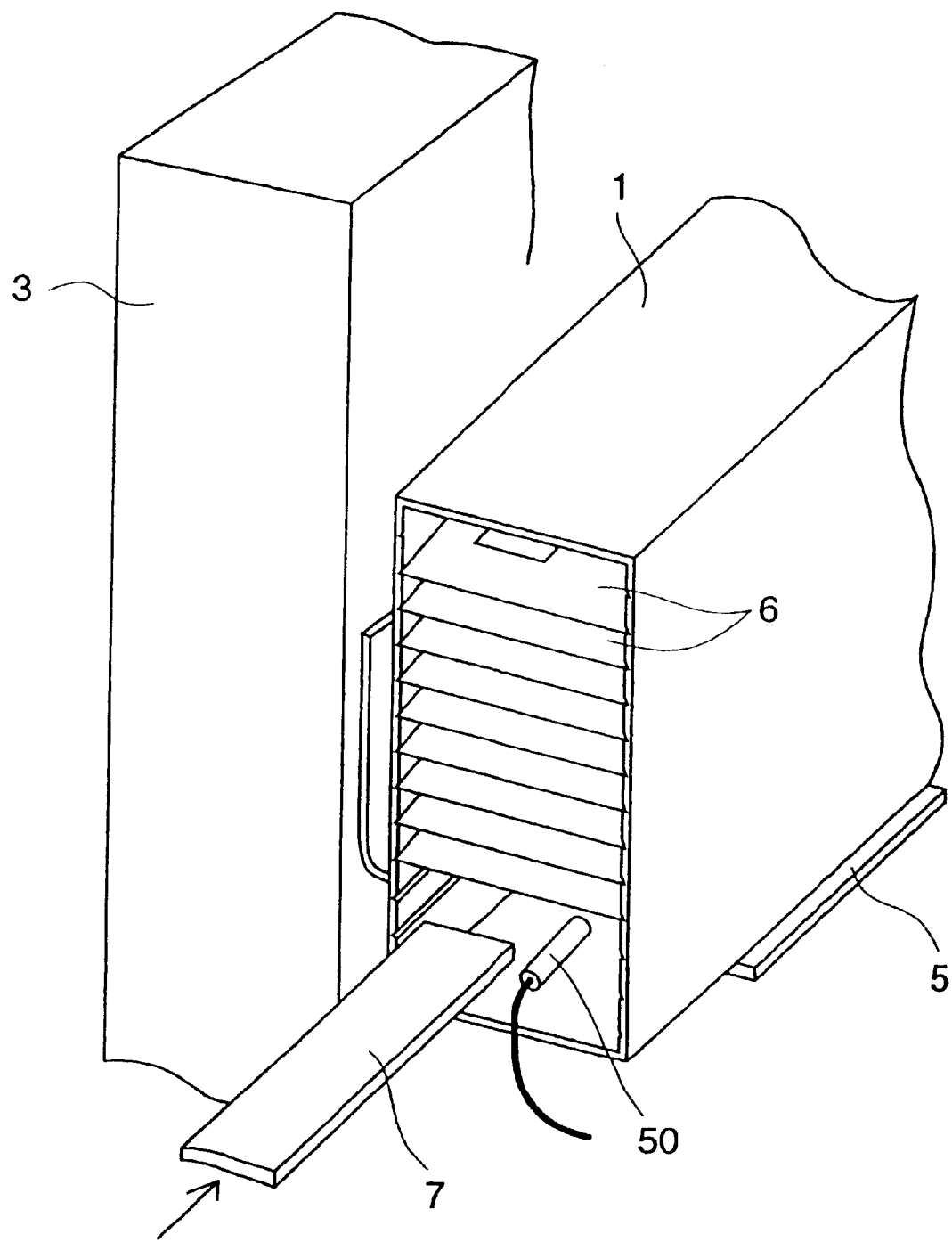
FIG. 2 is a perspective view of an essential portion in FIG. 1.

More specifically, as shown in FIGS. 1 and 2, a frame presence-or-absence sensor 50 is installed so as to be at the conveying path level of the frame conveying path 11a and on the opposite side of the loader side magazine 1 from the frame feeder 10. In other words, the sensor 50 that detects whether or not a lead frame is in the frame storing section of the magazine 1 is provided so as to horizontally (FIG. 1(a)) and vertically (FIG. 1(b)) correspond to the conveying path 11a of the frame feeder 10, and this sensor 50 is located so that the magazine 1 is between the sensor 50 and the frame feeder 10.

Figure 3:
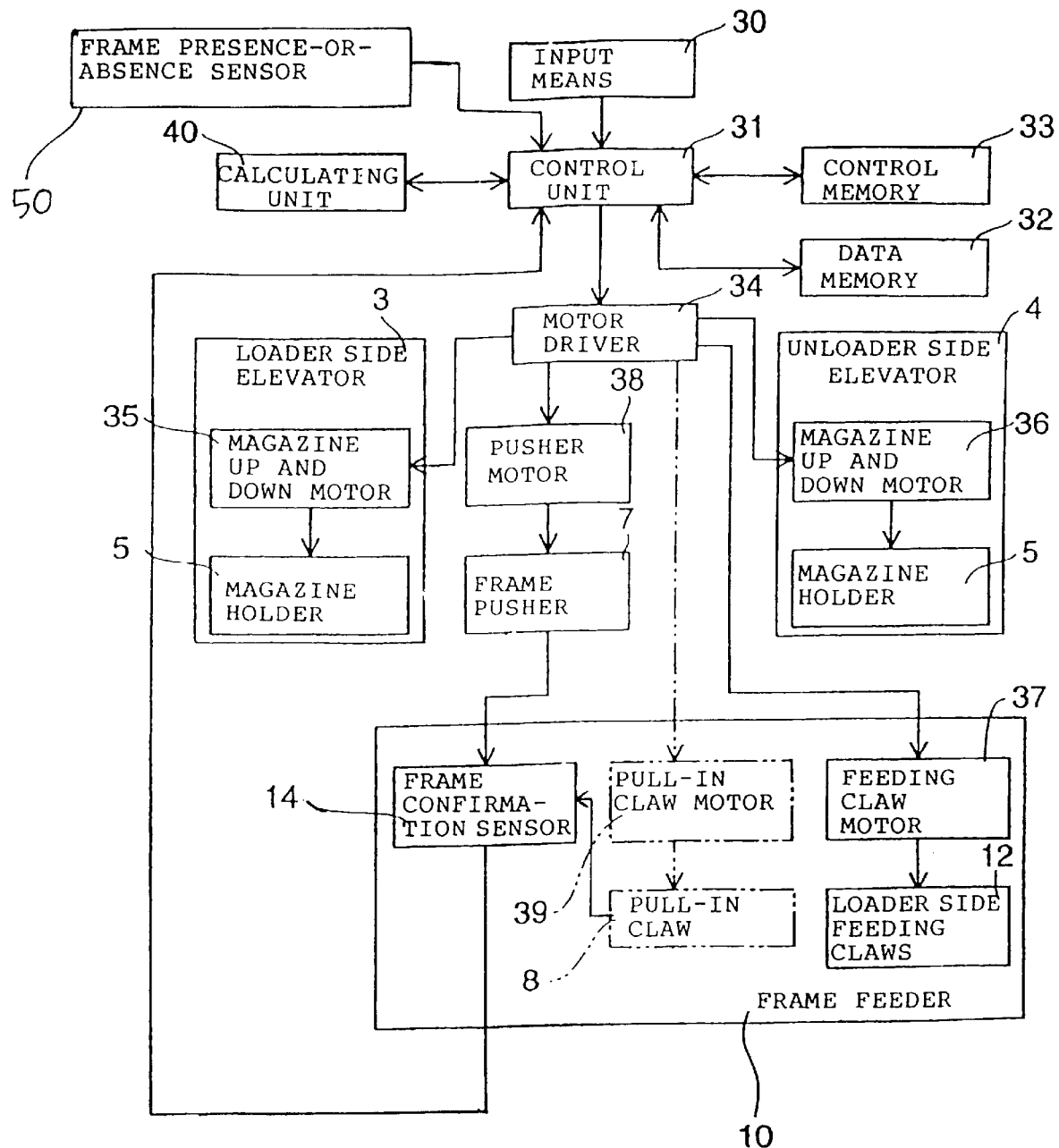
FIG. 3 is a block diagram of the control circuit used in the lead frame supplying method and apparatus of the present invention.
Figure 4A:
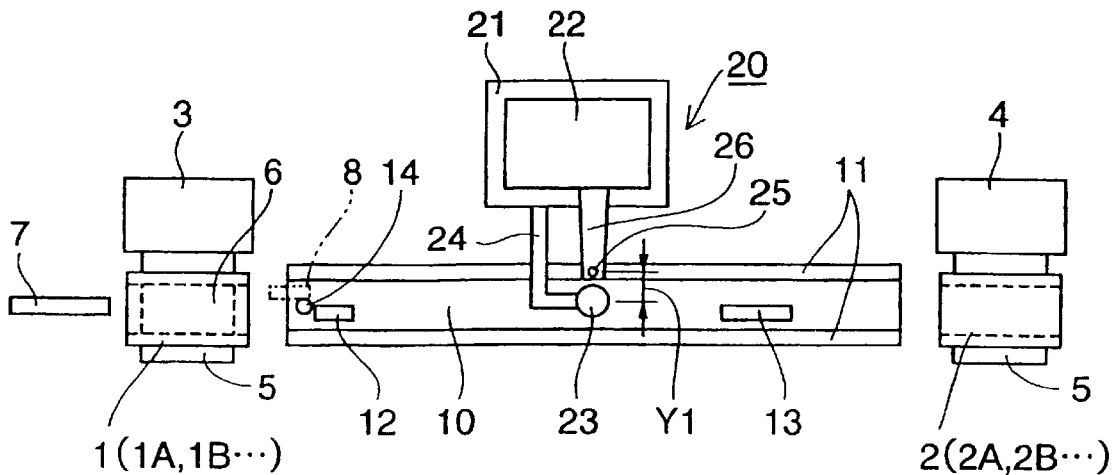
FIG. 4(a) is a top view thereof.
Figure 4B:
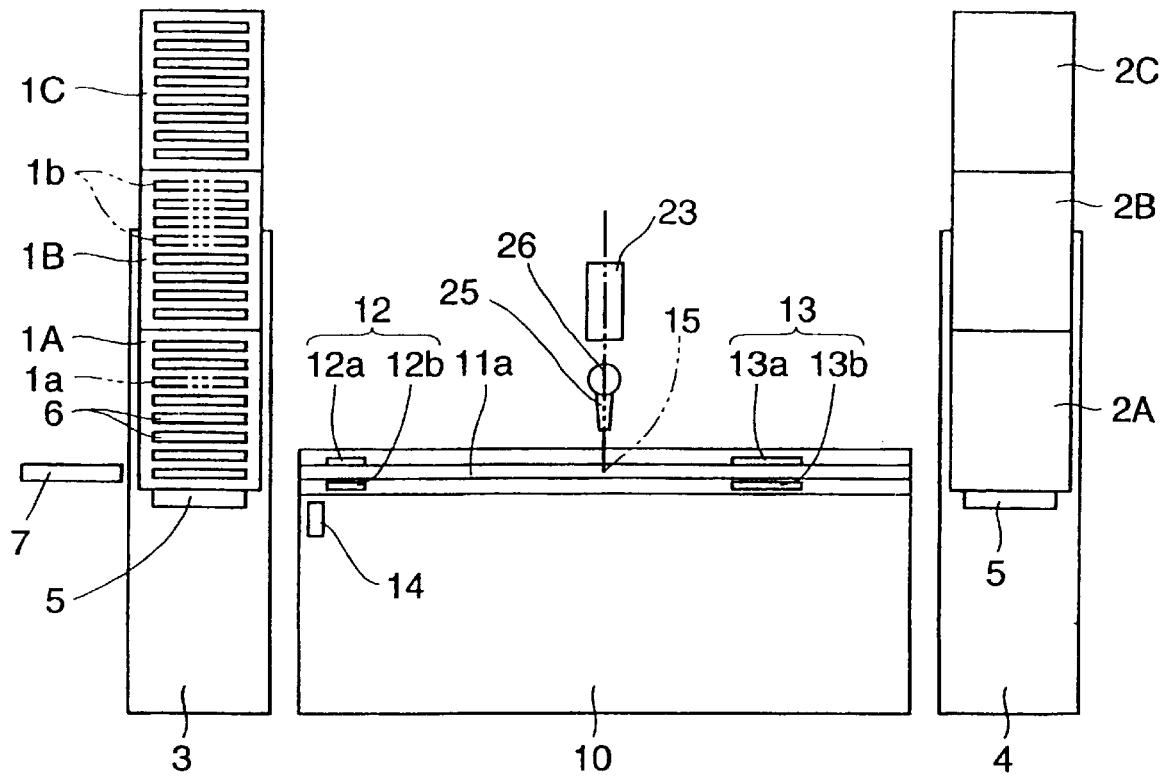
FIG. 4(b) is a sectional front view thereof.

FIG. 3 shows the control circuit used in the method and apparatus shown in FIGS. 1 and 2.

Various types of data required to operate the apparatus are inputted via an input means 30 and stored in a data memory 32 via a control unit 31. In other words, data such as the number N of frame storing sections of the magazines 1 and 2, the pitch P of the frame storing sections, and the dimension H from the uppermost frame storing section of the loader side magazine 1A to the lowermost frame storing section of the loader side magazine 1B located above the loader side magazine 1A, etc. are stored in the data memory 32 through the control unit 31. Programs which operate the apparatus via the control unit 31 are stored in a control memory 33.

The control unit 31 reads out data stored in the data memory 32 in accordance with the programs of the control memory 33 and drives magazine up and down motors 35 and 36 of the loader side elevator 3 and unloader side elevator 4, a feeding claw motor 37, and a pusher motor 38 or pull-in claw motor 39, via a motor driver 34. The circuit described above is known in the prior art.

With the structure above, the control unit 31 operates the magazine raising-and-lowering motor 35 of the loader side elevator device 3 in accordance with a signal that indicates that the frame presence-or-absence sensor 50 has detected the absence of a lead frame 6. Upon this signal, the loader side magazine 1 is lowered one pitch via the magazine holder 5 by the elevator device 3 operated by the magazine raising-and-lowering motor 35.

A more detailed operation will be described below, in which the frame pusher 7 is used to feed out the lead frame 6 from the magazine 1. The description will begin from a state in which the lowermost frame storing section 1a' of the loader side magazine 1A is positioned at the conveying path level of the frame conveying path 11a as shown in FIG. 1 (b).

When the apparatus is started, the loader side magazines 1 (1A, 1B . . . ) are lowered one stage at a time by the loader side elevator device 3, and a frame storing section of one of the loader side magazines 1 (1A) is positioned at the conveying path level of the frame conveying path 11a each time the magazines are lowered; and the frame presence-or-absence sensor 50 detects the presence or absence of a lead frame 6 in the frame storing section of the lead frame magazine.

If a lead frame 6 is in the frame storing section or the sensor 50 senses the presence of the lead frame 6, then the frame pusher 7 operates so as to push the lead frame 6 out of the frame storing section to a position where the lead frame 6 can be chucked by the loader side feeding claws 12.

Next, the loader side feeding claws 12 are closed to chuck the lead frame 6, and the lead frame 6 is intermittently fed along the frame conveying path 11a of the guide rails 11, so that the bonding portions of the lead frame 6 are successively fed to the bonding position 15.

When the frame confirmation sensor 14 confirms that the lead frame 6 has been completely fed out of the frame storing section and fed into the space between the guide rails 11, the magazine holder 5 is lowered by one pitch P (which is stored in the data memory 32 shown in FIG. 3), so that the next lead frame 6 in the next (upper) frame storing section is positioned at the conveying path level of the frame conveying path 11a.

Afterward, the magazine holder 5 is lowered by one pitch P each time that a lead frame 6 is fed out into the space between the guide rails 11.

When a lead frame storing section 1a of the loader side magazine 1A which contains no lead frame 6 is positioned at the conveying path level of the frame conveying path 11a of the frame feeder 10, the frame presence-or-absence sensor 50 detects the absence of a lead frame 6. As a result, in accordance with the resulting (no-frame) signal from the frame presence-or-absence sensor 50, the control unit 31 sends a signal which lowers the magazine holder 5 by one pitch P to the magazine raising-and-lowering motor 35 via the motor driver 34. In other words, when no lead frame is detected in the frame storing section, the frame pusher 7 does not operate; instead, only the magazine holder 5 is lowered by the magazine raising-and-lowering motor 35 so that the next lead frame storing section of the loader side magazine 1A is positioned at the conveying path level of the frame conveying path 11a of the frame feeder 10.

Such an operation is successively repeated until the lead frame 6 in the uppermost frame storing section of the loader side magazine 1A is positioned at the conveying path level of the frame conveying path 11a, and then this lead frame 6 is fed out. In other words, the feed-out operation of lead frames 6 into the guide rails 11 is performed or repeated a number of times equal to the number N of frame storing sections of each loader side magazine 1 (the frame storing section number N is stored in the data memory 32 shown in FIG. 3).

Following this operation, the magazine holder 5 is lowered by an amount that corresponds to the data H (which is the distance from the uppermost frame storing section of the loader side magazine 1A to the lowermost frame storing section of the loader side magazine 1B located above the loader side magazine 1A and is stored in the data memory 32). As a result, the lowermost lead frame 6 of the loader side magazine 1B is positioned at the conveying path level of the frame conveying path 11a, so that this lead frame 6 is ready to be fed out into the guide rails 11.

Then, the lead frame 6 in the lowermost frame storing section of the loader side magazine 1B is fed out into the guide rails 11 and supplied to the working position (bonding position) by the frame feeder. Bonding is performed on this lead frame 6, and the loader side magazine 1A is discharged by an operation described in, for instance, Japanese Patent Application Publication (Kokoku) No. H1-32127 before the signal that allows feeding out of the next lead frame 6 into the guide rails 11 arrives. After the discharge of the loader side magazine 1A, the magazine holder 5 is raised, and the loader side magazines 1B, 1C . . . are positioned on the magazine holder 5.

Subsequently, the lead frames 6 in the loader side magazine 1B, 1C . . . are fed out into the guide rails 11 by the operation described above.

In the meantime, in the loader side magazine 1B, lead frames 6 are absent from some of the frame storing sections 1b beginning at an intermediate point as indicated by the two-dot chain lines as best seen from FIG. 1 (b). Accordingly, for such empty frame storing sections 1b, only the lowering operation of the magazine holder 5 is performed. Then, when the number of lowering operations of the magazine holder 5 reaches the number N of the frame storing sections in one loader side magazine 1 (stored in the data memory 32), the lowermost lead frame 6 of the loader side magazine 1C is positioned at the conveying path level of the frame conveying path 11a, so that the lead frame 6 in the magazine 1C can be fed out into the guide rails 11, and the loader side magazine 1B is discharged.

In the above embodiment, the lead frames 6 are fed out from the loader side magazines 1 by the frame pusher 7. However, the present invention is applied in a case where a pull-in claw device 8 is used for feeding-out the lead frames. Moreover, the frame presence-or-absence sensor 50 is not necessarily installed at the conveying path level of the frame conveying path 11a of the frame feeder 10 as described above; and it is also possible to install the frame presence-or-absence sensor 50 above the frame conveying path level. In addition, the frame confirmation sensor 14 may be omitted; however, with such a sensor 14 employed, the feeding out of lead frames 6 from the loader side magazines 1 onto the frame conveying path 11a can be checked in a reliable manner.

As seen from the above, according to the present invention, a sensor which detects the presence or absence of a lead frame inside the loader side magazine is installed at the frame conveying path level or above the frame conveying path level of the frame feeder so that the sensor is on the opposite side of the loader side magazine from the frame feeder; and when this sensor means detects the absence of a lead frame in one frame storing section, a next frame storing section that contains a lead frame is positioned at the frame conveying path level of the frame feeder. Accordingly, lead frame storing sections that contain lead frames can immediately be positioned at the lead frame conveying path level, so that productivity can be improved.

What is claimed is:

1. A lead frame supplying method in which a loader side magazine is positioned and carried on a loader side elevator which is driven upward and downward, and lead frames stored vertically spaced apart in lead frame storing sections of said loader side magazine are fed-out and supplied to a lead frame feeder which is positioned on one side of said loader side magazine, said method being characterized by the steps of detecting a presence and an absence of a lead frame inside said lead frame storing sections of said loader side magazine by means of a sensor means installed at a lead frame conveying path level or above said lead frame conveying path level of said lead frame feeder so as to be on an opposite side of said loader side magazine from said lead frame feeder, positioning a next lead frame storing section at said lead frame conveying path level of said lead frame feeder when said sensor means detects an absence of a lead frame in a lead frame storing section until said sensor detects a presence of a lead frame in said next lead frame storing section, and feeding said lead frame out of said loader side magazine.

2. A lead frame supplying apparatus in which a loader side magazine is positioned and carried on a loader side elevator which is driven upward and downward, and lead frames stored vertically spaced apart in lead frame storing sections of said loader side magazine are fed out and supplied to a lead frame feeder which is positioned on one side of said loader side magazine, said apparatus further comprising:

a sensor means installed at a lead frame conveying path level or above said lead frame conveying path level of said lead frame feeder so as to be on an opposite side of said loader side magazine from said lead frame feeder, said sensor means detecting a presence and an absence of a lead frame inside a lead frame storing section of said loader side magazine, a control circuit which includes a control unit that positions a next lead frame storing section at said lead frame conveying path level of said lead frame feeder when said sensor means detects an absence of a lead frame in a lead frame storing section of said loader side magazine until said sensor means detects a presence of a lead frame in said next lead frame storing section, and feeding said lead frame out of said loader side magazine.

\* \* \* \* \*